United States Patent
Hegde et al.

(10) Patent No.: US 6,545,580 B2
(45) Date of Patent: Apr. 8, 2003

(54) ELECTROMAGNETIC FIELD GENERATOR AND METHOD OF OPERATION

(75) Inventors: Hari S. Hegde, Flushing, NY (US); Mihai S. Risca, Port Washington, NY (US); Alan V. Hayes, Centerport, NY (US); Abraham J. Navy, Bellerose, NY (US); Roger P. Fremgen, E. Northport, NY (US)

(73) Assignee: VEECO Instruments, Inc., Plainview, NY (US)

( * ) Notice: Subject to any disclaimer, the term of this patent is extended or adjusted under 35 U.S.C. 154(b) by 0 days.

(21) Appl. No.: 09/150,274

(22) Filed: Sep. 9, 1998

(65) Prior Publication Data

US 2002/0047767 A1 Apr. 25, 2002

(51) Int. Cl.[7] .................. C23C 14/00; C25B 11/00; C25B 13/00; H01F 1/00; H01F 5/00
(52) U.S. Cl. .............. 335/296; 335/297; 335/299; 335/210; 335/213; 204/298.16
(58) Field of Search ................ 335/296–299, 335/211–214; 336/170, 171, 180–184, 212; 204/298.16–298.22; 313/440; 315/8

(56) References Cited

U.S. PATENT DOCUMENTS

| | | | |
|---|---|---|---|
| 4,222,814 A | 9/1980 | Reitz ................... 156/612 |
| 4,391,044 A | 7/1983 | Wheeler ................. 33/174 |
| 4,673,482 A | 6/1987 | Setoyama et al. ........ 204/298 |
| 4,784,739 A | 11/1988 | Kadokura et al. ....... 204/192.2 |
| 4,806,896 A | * 2/1989 | Shikano et al. .......... 386/73 |
| 4,949,783 A | 8/1990 | Lakios et al. .......... 165/80.1 |
| 5,026,470 A | 6/1991 | Bonyhard et al. ..... 204/298.16 |
| 5,045,166 A | 9/1991 | Bobbio .............. 204/192.32 |
| 5,086,259 A | * 2/1992 | Sakurai et al. ......... 315/368.25 |
| 5,198,718 A | 3/1993 | Davis et al. ............ 313/359.1 |
| 5,290,416 A | 3/1994 | Tong et al. ........... 204/298.16 |
| 5,423,915 A | 6/1995 | Murata et al. ............ 118/723 E |
| 5,455,197 A | 10/1995 | Ghanbari et al. ............ 437/192 |
| 5,468,519 A | 11/1995 | Akiyama et al. ............ 427/532 |
| 5,589,039 A | 12/1996 | Hsu ....................... 204/192.12 |
| 5,719,542 A | * 2/1998 | Park et al. ................. 313/440 |
| 5,877,666 A | * 3/1999 | Johnson, Jr. et al. ....... 336/180 |

FOREIGN PATENT DOCUMENTS

FR     2 558 298 A     7/1985

OTHER PUBLICATIONS

G. Aston, H.R. Kaufman & P.J. Wilbur, *Ion Beam Divergence Characteristics of Two–Grid Accelerator Systems*, AIAA Journal vol. 16, N. 5, May 1978, pp. 516–524.

R. Limpaecher & K.R. MacKenzie, *Magnetic Multipole Containment of Large Uniform Collisionless Quiescent Plasmas*, Rev. Sci. Instrum., vol. 44, N. 6, Jun. 1973, pp. 726–731.

(List continued on next page.)

*Primary Examiner*—Ramon M. Barrera
(74) *Attorney, Agent, or Firm*—Morgan & Finnegan, LLP

(57) ABSTRACT

An electromagnetic field generator and method of operation for ion beam deposition of magnetic thin-film materials is presented. A combination of open frame electromagnetic field generator elements provides precise control of magnetic field directionality. This control enables deposition of oriented magnetic films with minimal directionality error. The magnetic field direction may be oriented to enable the deposition of alternating layers of directionally oriented magnetic films. An open frame element reduces the weight of the electromagnetic field generator while truncated corners reduce diagonal clearance that may be required in a vacuum chamber. An open frame design also enables the electromagnetic field generator to surround and thus remain clear of the active deposition area; the electromagnetic field generator can thus be shielded from accumulation of sputtered material. Shielding from accumulation of sputter material reduces maintenance requirements.

28 Claims, 10 Drawing Sheets

OTHER PUBLICATIONS

K.N. Leung, T.K. Samec & Lamm, *Optimization of Permanent Magnet Plasma Confinement*, Physics Letters, vol. 51A, N. 8, May 5, 1975, pp. 490–492.

R. Lossy & J. Engemann, *Characterization of a reactive broad beam radio–frequency ion source*, J. Vac. Sci. Technol. B., vol. 6, N. 1, Jan./Feb. 1988, pp. 284–287.

Ch. Huth, H.C. Scheer, B. Schneemann & H.P. Stoll, *Divergence Measurements for Characterization of the Micropatterning Quality of Broad Ion Beams*, J. Vac. Sci. Technol. A., vol. 8, N. 6, Nov./Dec. 1990, pp. 4001–4010.

T. Shirakawa, H. Toyoda & Hideo Sugai, *RF Plasma Production at Ultralow Pressures with Surface Magnetic Confinement*, Japanese Journal of Applied Physics, vol. 29, v. 6, Jun. 1990, pp. L1015–L1018.

Patent Abstracts of Japan, vol. 010, No. 060 (P–435), Mar. 11, 1986 & JP 60 202526 A (Konishiroku Shashin Kogyo KK; others: 01), Oct. 14, 1985.

Patent Abstracts of Japan, vol. 006, No. 160 (E–126), Aug. 21, 1982 & JP 57 080713 A (Canon Inc.; others: 01), May 20, 1982.

PCT International Search Report (PCT/US99/20470).

* cited by examiner

ELECTROMAGNETIC FIELD GENERATOR AND METHOD OF OPERATION

FIELD OF THE INVENTION

This invention relates to deposition of magnetic materials. More particularly, the invention relates to an electromagnetic field generator for improved deposition of magnetic materials and a method of operation.

BACKGROUND OF THE INVENTION

Deposition systems (e.g. ion beam, physical vapor, and evaporation deposition) are capable of depositing high-quality thin films of a wide variety of materials on many different types of substrates. Applications for ferromagnetic thin films, such as deposition of magnetoresistive (MR) and giant magnetoresistive (GMR) films for thin-film magnetic heads, usually require orientation of the magnetic moments in a specific direction by application of an external magnetic field. The required field strength is usually 20–100 Gauss.

It has been found, however, that DC magnetic fields are troublesome for plasma deposition systems due to interactions between the magnetic field and the plasma. Such interactions can, for example, decrease the thickness uniformity of the deposited magnetic film as a result of decreased plasma uniformity. We have also found that magnetic fields in the deposition chamber can adversely affect ion beam deposition processes even at levels as low as 10–15 Gauss due to interactions of the magnetic fields with the ion beam. During ion beam deposition, magnetic field disturbances can cause broadening or displacement of the ion beam which can result in film contamination. Further, the electrons in the ion beam chamber, which normally act to neutralize any charge build-up on the substrate, are very easily trapped by magnetic fields. Such trapping can cause loss of neutralization and subsequent arc damage on any exposed insulating surfaces on the substrate or any electrostatic discharge-sensitive device structures embedded in the substrate wafer, such as magnetoresistive sensors. This is particularly important if an ion-assisted deposition process is used because the assisting ion beam is aimed at the substrate directly.

What is needed is a method of depositing magnetic materials in a deposition system in the presence of an assisting magnetic field without disrupting the source or creating charge build-up on the sample or in the chamber.

SUMMARY OF THE INVENTION

In accordance with the present invention, there is described an electromagnetic field generator and method of operation for deposition of magnetic materials. The electromagnetic field generator comprises an open frame electromagnetic assembly having a first pair of spaced apart magnetic members for generating on a substrate a magnetic field in a first direction and a second pair of magnetic members for generating a magnetic field on the substrate in a second direction. Preferably the electromagnetic field generator includes a second electromagnetic assembly spaced apart from the first assembly and magnetically linked to the first assembly to enhance field uniformity on the substrate. The method comprises the steps of: placing a sample within an electromagnetic field generator with at least two selectable magnetic field orientations; operating a source, for example an ion source or plasma source, to deposit material onto the sample influenced by the electromagnetic field generator; and creating a field pattern around the sample with the electromagnetic field generator to control the deposition of the magnetic material.

There are also described various methods for control of deposited materials using different current signals applied to the electromagnetic field generator, with resultant different magnetic fields. The currents include alternating current; positive/negative pulsed direct current; exponentially decaying alternating current; half-wave rectified alternating current; positive-pulsed direct current; positive direct current bias; pulsed direct current with positive direct current bias; and time phased magnetic field and ion generator operation.

An objective is that a combination open frame/base plate electromagnetic field generator provides measured magnetic field directionality within a tolerance of 0.5 degrees over a six inch square substrate or an eight inch circular substrate. This enables deposition of oriented magnetic films with minimal error in directionality.

Another objective is the ability to orient the magnetic field in any arbitrary direction which enables the deposition of alternating layers of differently oriented magnetic films.

Another objective is the ability to continuously change the orientation of the magnetic field in a rotating manner, so as to demagnetize the deposited film.

Another objective is that it provides a uniform magnetic field region over a sample with field uniformity of +/−5%.

Another objective is the reduction in weight afforded by the open frame top plate with its truncated corners. The truncated corners also reduce the diagonal clearance required in the chamber to accommodate the field generator. The open frame design also enables the electromagnetic field generator to surround and thus remain clear of the active deposition area; the electromagnetic field generator can thus be shielded from accumulation of sputtered material. This reduces the level of maintenance required to keep the field generator in peak operating condition.

It is not intended that the invention be summarized here in its entirety. Rather, further features, aspects, and advantages of the invention are set forth in or are apparent from the following description and drawings.

DESCRIPTION OF THE INVENTION

The invention describes an apparatus with various alternative embodiments and methods of operation to control material deposition.

Apparatus

The terms substrate, wafer and sample are to be used interchangeably throughout this specification. The term open-frame member is intended to be descriptive and within the specification and claims is intended to describe a member that has a larger open area. Thus, an open-frame member is contrasted with a substantially solid member, the substantially solid member being understood to have a smaller open area than the open-frame member. The term substantial or substantially is also used in the specification and the claims, and is intended to be a term of description allowing for some variation, without any particular defining quantitative measure.

Figure 1:
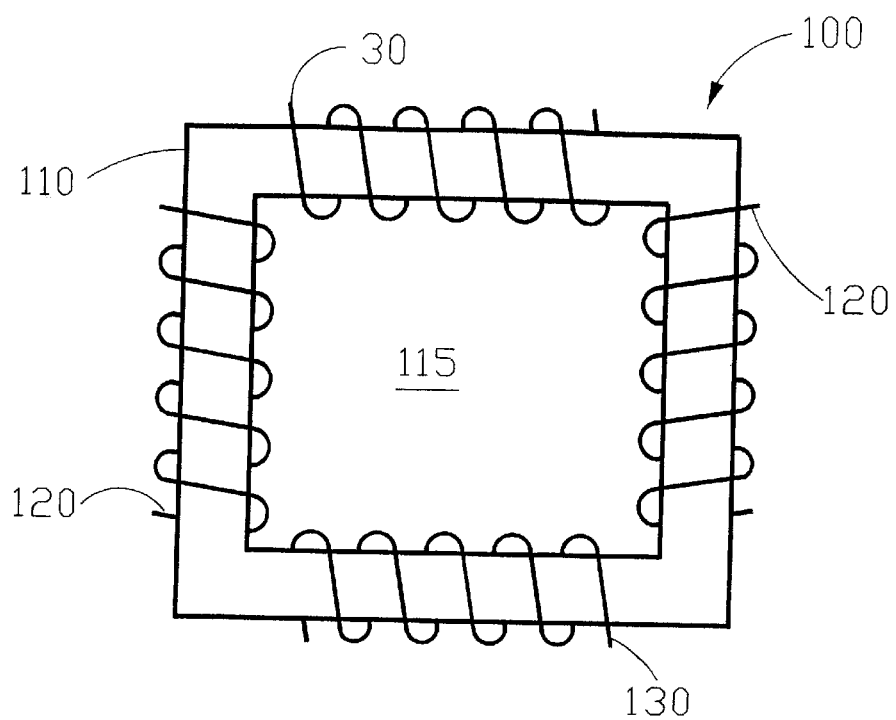
FIG. 1 is a top view of a single frame electromagnetic field generator.

Referring first to FIG. 1, a first embodiment of an electromagnetic field generator in accordance with the invention is shown. Specifically, the generator comprises an open frame member 110 having a first pair of spaced apart magnetic members 120 for generating on a substrate 115 a magnetic field in a first direction and a second pair of spaced apart magnetic members 130 for generating a magnetic field on the substrate in a second direction. Preferably, magnetic members 120 are disposed perpendicular to magnetic members 130 so that the first and second magnetic fields are orthogonal. Open frame 110 may be constructed, for example, of any of the variety of soft steels.

Figure 11A:
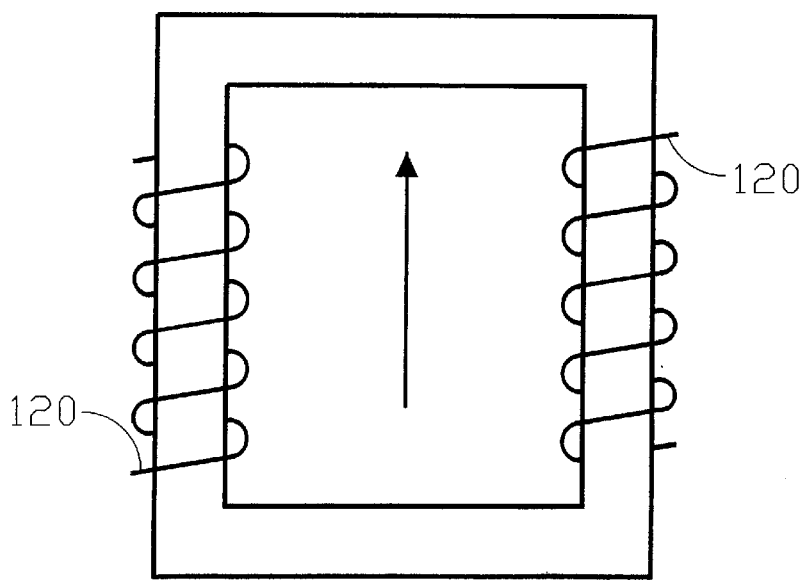
FIG. 11A is a top view of a single frame electromagnetic field generator with a first pair of coils energized to produce a field in a first direction.
Figure 11B:
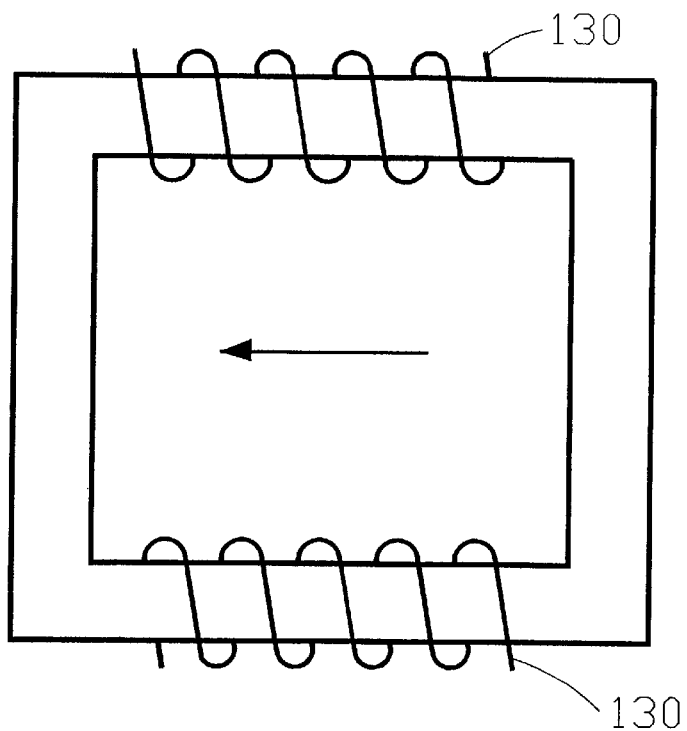
FIG. 11B is a top view of a single frame electromagnetic field generator with a second pair of coils energized to produce a field in a second direction.

Referring to FIGS. 11A and 11B, the orthogonal pairs of coils 120 and 130 may be selectively activated to enable deposition of orthogonally oriented magnetic films. In FIG. 11A, the magnetic field is formed in a first direction when coils 120 are energized. In FIG. 11B, the magnetic field is formed in a second direction when coils 130 are energized. Energizing both coils simultaneously can yield any arbitrary field orientations, with the orienting direction being proportional to the ratio of the currents through the two coils.

Figure 2:
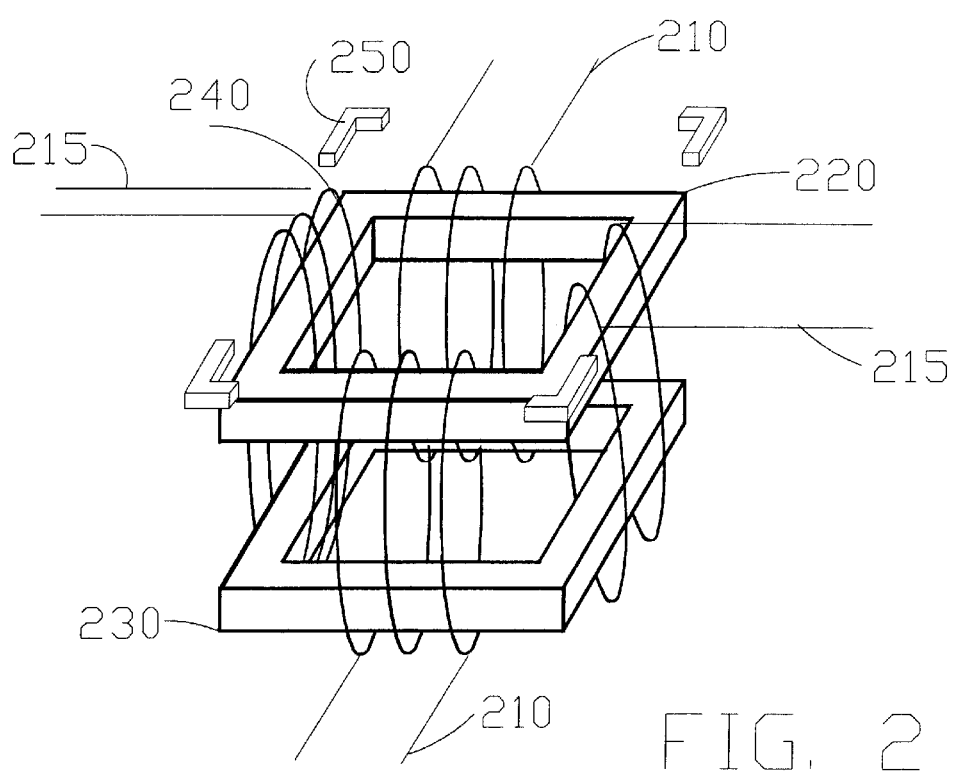
FIG. 2 is a perspective view of a four-coil two-open frame electromagnetic field generator with pole pieces.

FIG. 2 is a perspective view of a four-coil two-open frame electromagnetic field generator according to a second embodiment of the invention. The pairs of coils 210 and 215 are wrapped around open frame members 220 and 230 to induce a magnetic field in central opening 240. Orthogonally oriented magnetic fields are applied using opposing coil pairs 210 and 215. The induced magnetic fields are most uniform within the central opening 240, but also extend above the opening, where a wafer or substrate (not illustrated) would most preferentially be positioned. Four pole pieces 250 at each corner help shape the electromagnetic field and increase the field uniformity, especially above central opening 240. Pole pieces 250 may be constructed, for example, from soft steel. To accommodate packaging with other components, open frame members 220 and 230 may have truncated or rounded corners.

Figure 3:
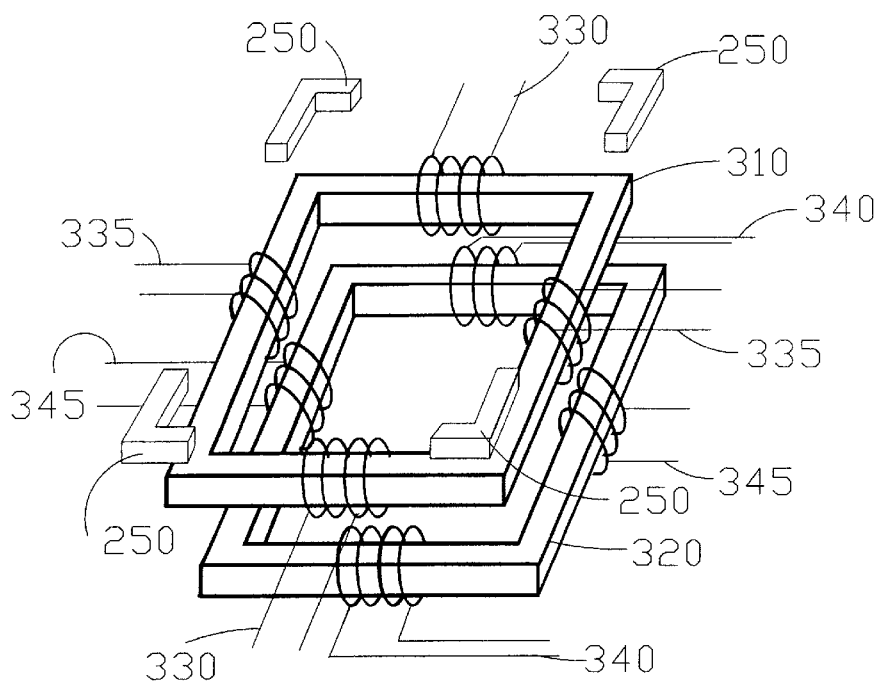
FIG. 3 is a perspective view of an eight-coil two-open frame electromagnetic field generator with pole pieces.

FIG. 3 is a perspective view of an eight-coil two-open frame electromagnetic field generator with pole pieces 250 according to a third embodiment of the invention. This embodiment differs from the second embodiment, illustrated in FIG. 2, in that an open frame 310 is wrapped with coil pairs 330 and 335 and open frame 320 is wrapped with coil pairs 340 and 345. Using individual coils for each open frame, this embodiment allows individual control of the current in each of the coils and thereby provides greater control over the magnetic field generated by each coil. To accommodate packaging with other components, open frames 310 and 320 may have truncated or rounded corners.

In an alternative embodiment for the embodiments illustrated in FIGS. 2 and 3, electrical windings 210, 215, 330, 335, 340 and 345 may be replaced by embedded windings or patterned electrodes.

Figure 4:
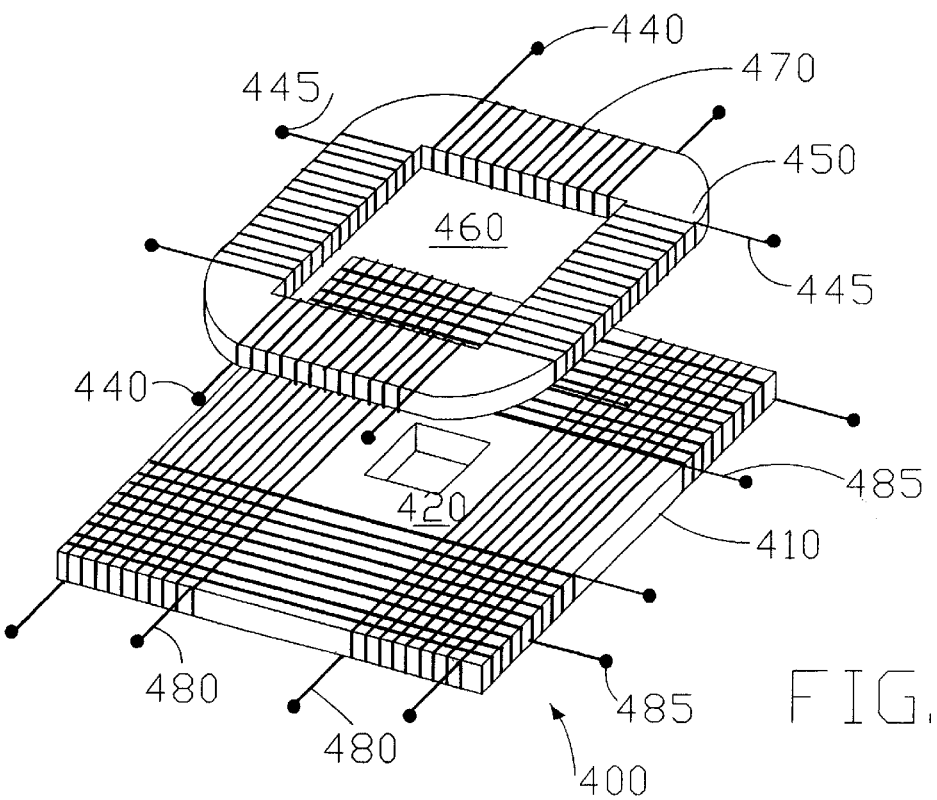
FIG. 4 is a perspective view of an electromagnetic field generator.

FIG. 4 is a perspective view of an eight-coil two-open-frame electromagnetic field generator. In this configuration, electromagnetic field generator 400 includes base plate 410 which may include a central opening 430. In this configuration, central opening 430 accommodates a wafer chuck (not shown) and other mechanical and electrical feed-through. Central opening 430 may also be surrounded by a winding-free zone 420 for mechanical connections. The remainder of base plate 410 is preferably wrapped with coil pairs 480 and 485 to induce the orthogonal magnetic fields as previously described. In another configuration, a substrate or wafer chuck and required feed-through may be supported from the side of electromagnetic field generator 400, thus eliminating the need for central opening 430.

In FIG. 4, an open frame member 450 has a first pair of spaced apart magnetic members 440 for generating on a substrate a magnetic field in a first direction and a second pair of spaced apart magnetic members 445 for generating a magnetic field on the substrate in a second direction. Open frame member 450 has central opening 460. To accommodate packaging with other components, top plate 450 may have truncated or rounded corners. Top plate 450 and base plate 410 are spaced apart to accommodate a substrate or wafer chuck between the plates and other mechanical and electrical components. Base plate 410 has magnetic field lines oriented in such a way that they reinforce the top plate 450 field lines in the desired direction and partially cancel undesired components in the other direction in order to create a more uniform field on the sample. Said differently, base plate 410 straightens and strengthens the field provided by top frame 450.

Though FIG. 4 is not illustrated with pole pieces, they may be used and oriented as illustrated in FIGS. 2 and 3. If used with the apparatus of FIG. 4, pole pieces help shape the electromagnetic field and increase field uniformity of the apparatus.

The wafer chuck (not shown) is preferably positioned within central opening 460 such that the wafer rests just above the center 470 of the magnetic field created by top plate 450. With respect to field uniformity, this is the preferred location. However, considering other factors, including cleanliness (keeping sputtered material off of the electromagnetic field generator) and shadowing, the substrate may be located above the center 470 of the magnetic field without substantially compromising magnetic field uniformity.

Figure 5A:
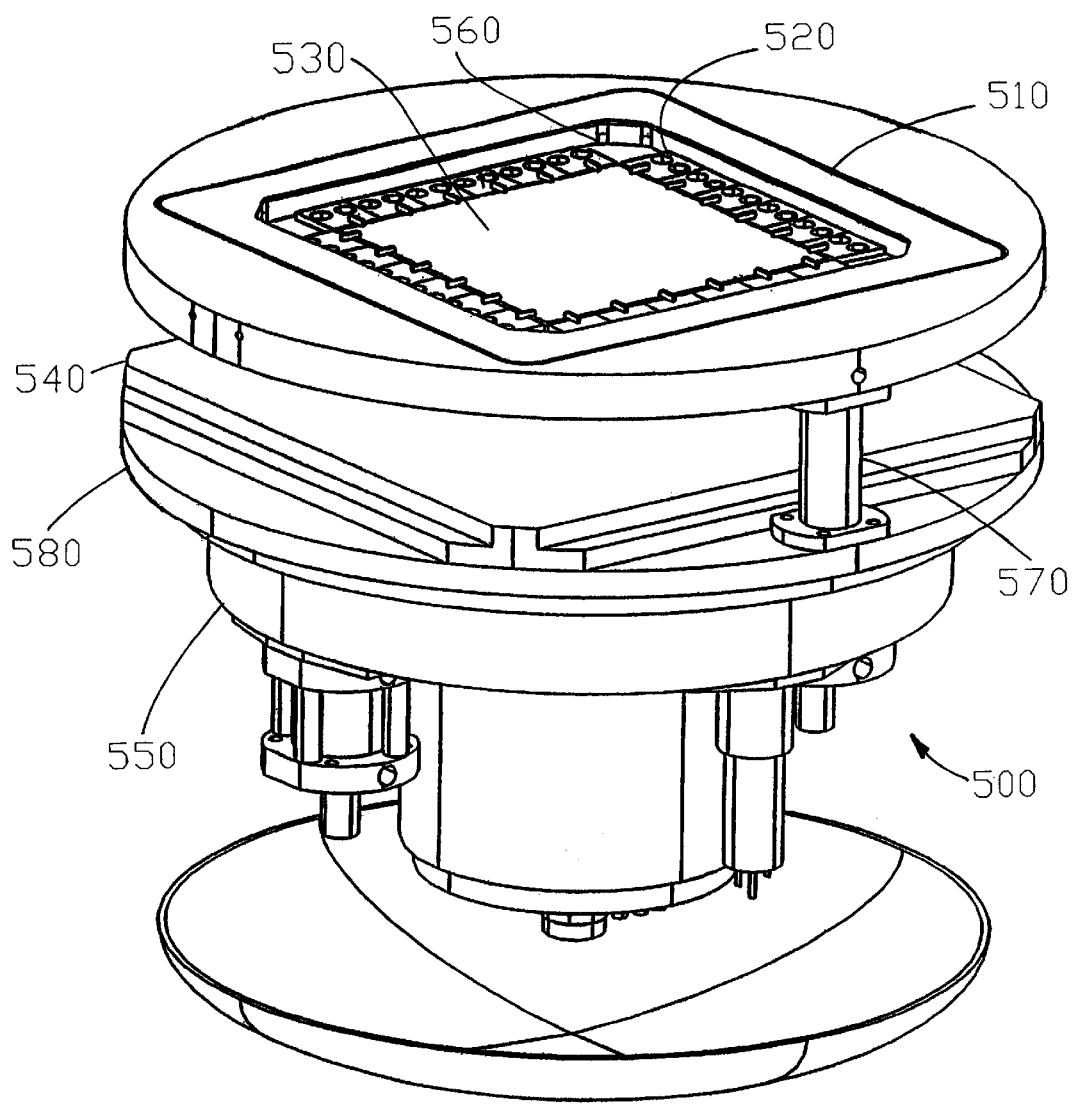
FIG. 5A is a detailed schematic perspective view of the electromagnetic field generator and wafer chuck.

FIG. 5A is a perspective view of the electromagnetic field generator and wafer chuck unit 500 according to one embodiment of the invention. Open frame apparatus 510 houses the magnetic field generator top plate, which could be in the form of an open frame 220 (FIG. 2) or 310 (FIG. 3) or 450 (FIG. 4). In this configuration, wafer 530 preferably rests slightly above the center of the induced magnetic field and slightly below the mid-plane of open frame apparatus 510. The wafer 530 is held in place by clips 520 which are attached to the wafer chuck 560.

Open frame apparatus 510 may be water-cooled and differentially pumped to a pressure between chamber base pressure and atmosphere, for example $10^{-3}$ Torr. Open frame apparatus 510 is supported above cover plate 540 by supports 570. Preferably, one of the supports 570 is hollow and accommodates the electrical and mechanical feed-through for open frame apparatus 510. Cover plate 540 encloses the open frame 230 (FIG. 2) or 320 (FIG. 3) or base plate 410 (FIG. 4) of the electromagnetic field generator. Regardless of the type of lower element, the base portion of the electromagnetic field generator lies below cover plate 540, and may be isolated from the surrounding vacuum chamber, or maintained at atmospheric pressure because the insulating materials associated with the electrical windings (480 & 485 in FIG. 4) are potential contaminants to the vacuum chamber.

Figure 5B:
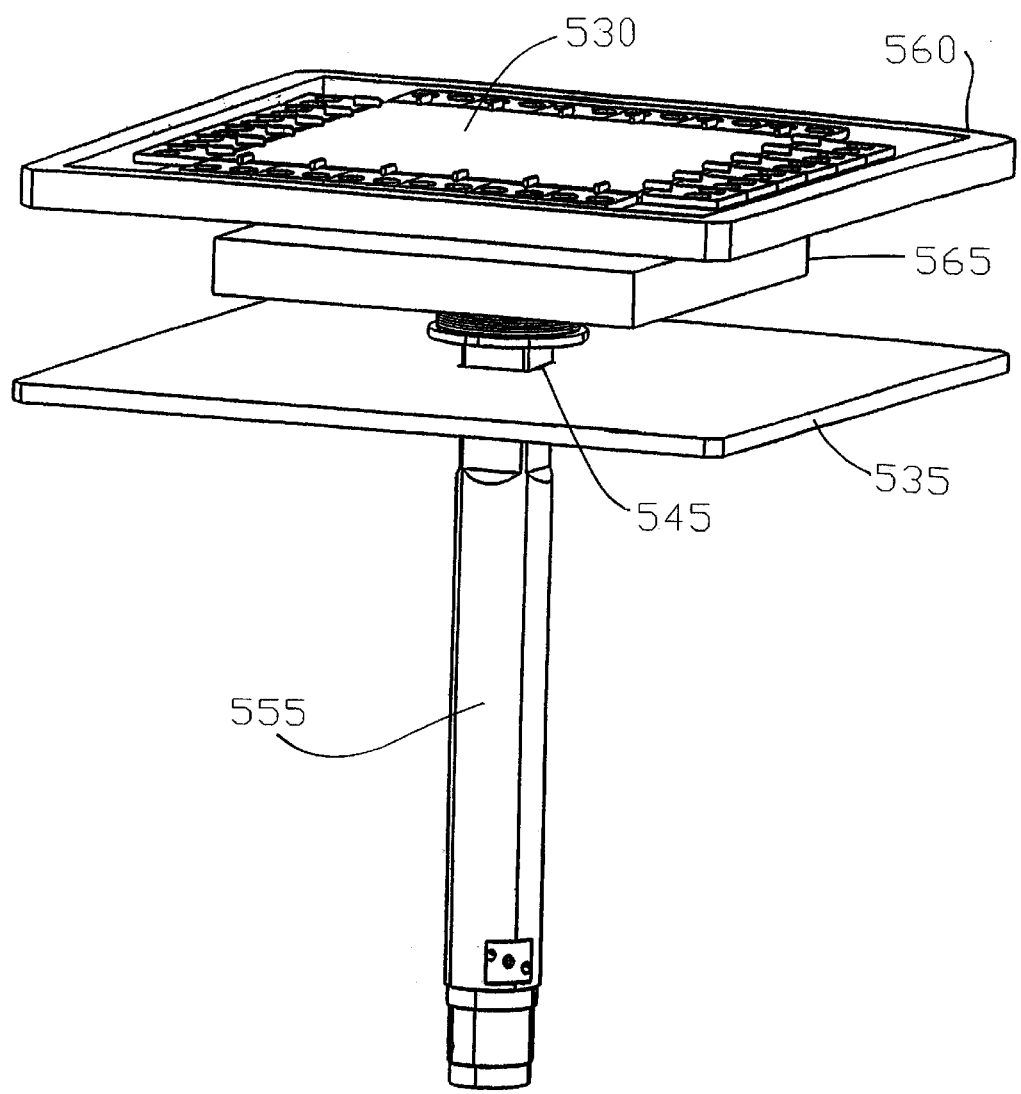
FIG. 5B is a detailed schematic perspective view of the wafer chuck and electromagnetic field generator base plate.
Figure 6:
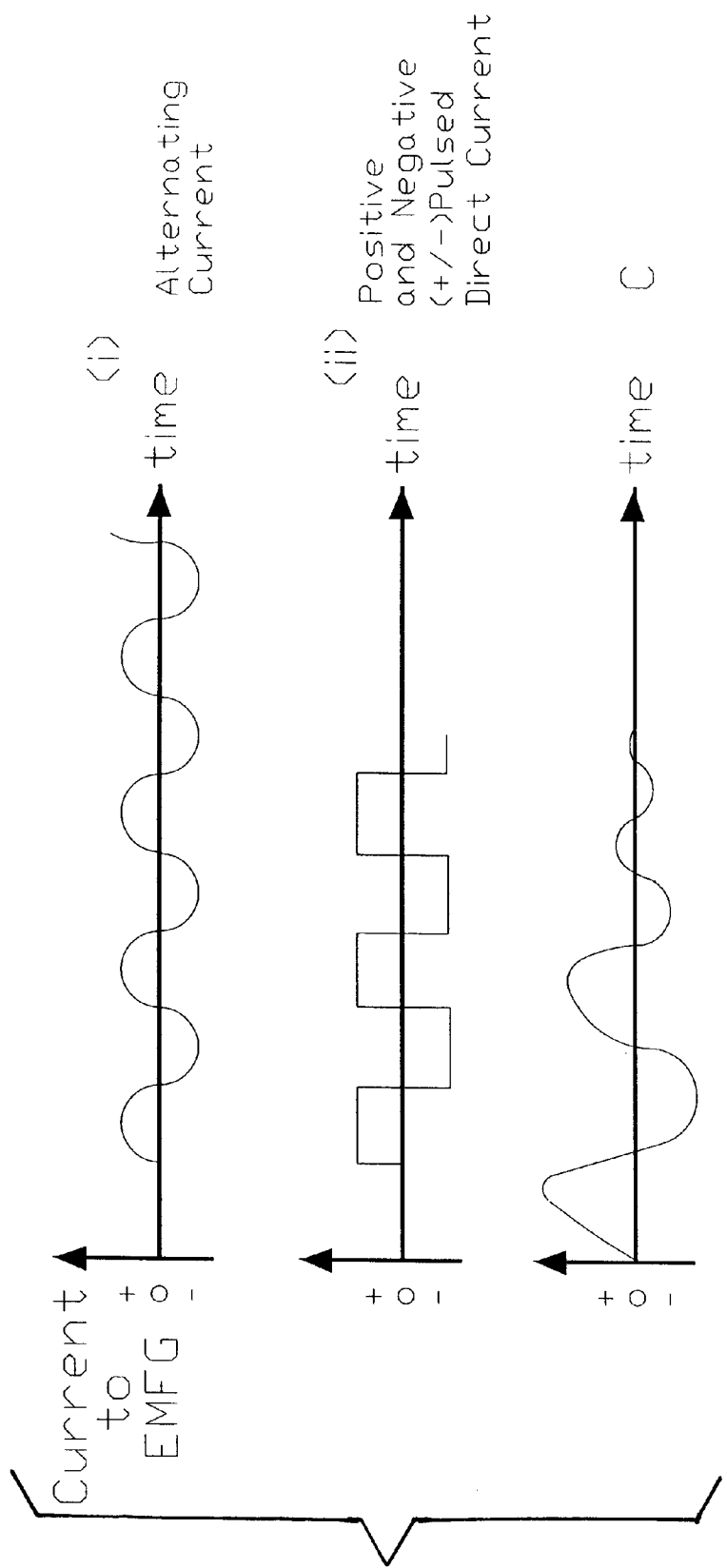
FIG. 6 is a plot of electromagnetic field generator current (a) vs. time using alternating current (AC), (b) vs. time using positive and negative (+/−) pulsed direct current (DC) and (c) vs. time using alternating current (AC) with an exponentially decaying amplitude.
Figure 7:
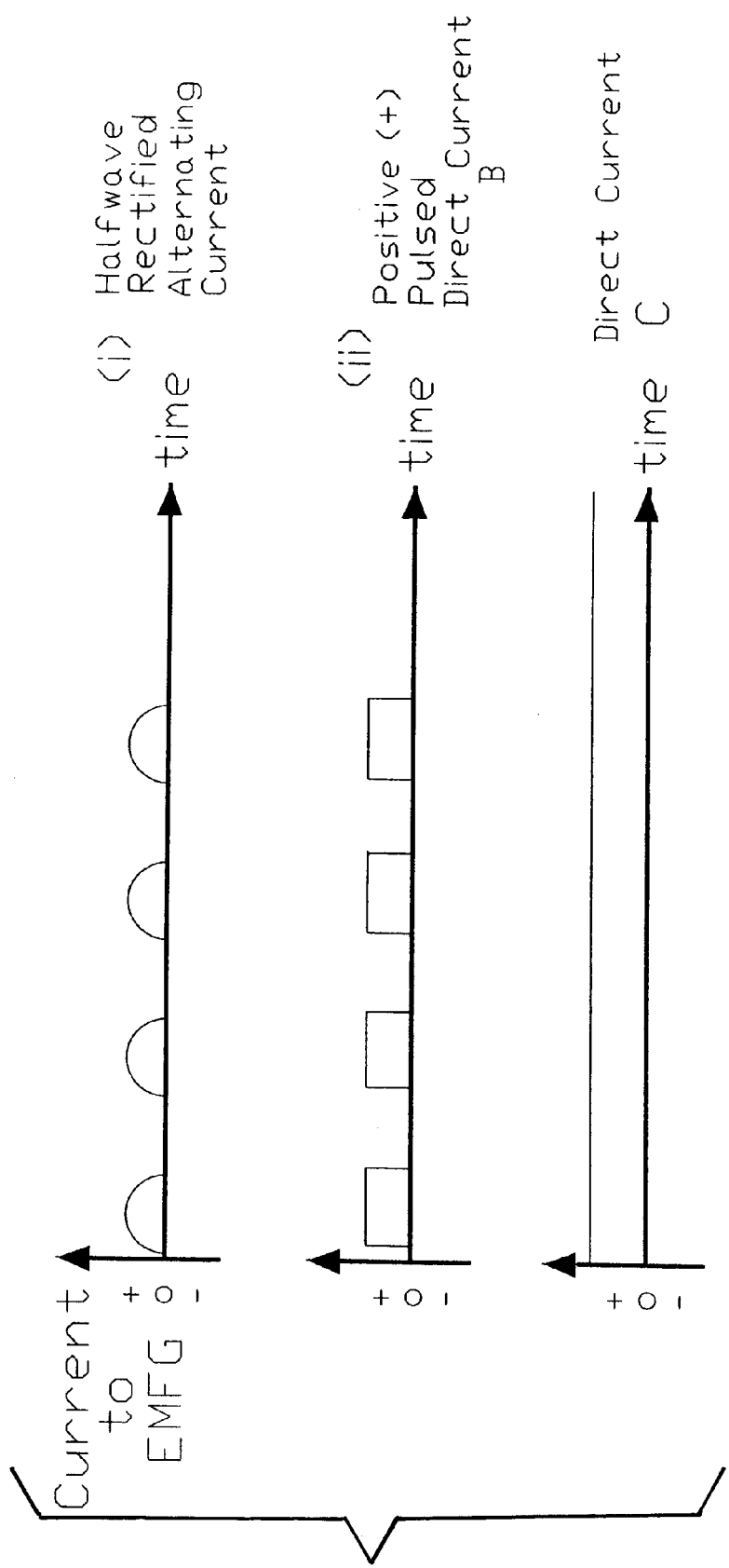
FIG. 7 is a plot of electromagnetic field generator current (a) vs. time using half-wave rectified alternating current, (b) vs time using positive (+) pulsed direct current, and (c) vs. time using a positive direct current bias.
Figure 8:
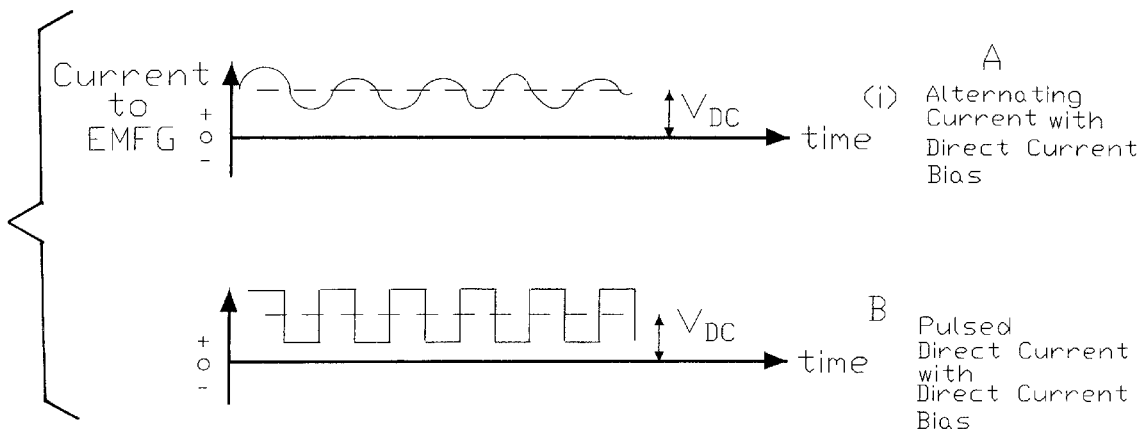
FIG. 8 is a plot of electromagnetic field generator current (a) vs. time using alternating current with a positive direct current bias and (b) vs. time using pulsed direct current with a positive direct current bias.

Cover plate 540 may also have a center opening, hidden from view in FIG. 5A. As shown in FIG. 5B, the shaft 555 of wafer chuck 560, may pass through that opening in the center of cover plate 540. The remaining support structure 550 shown in FIG. 5A preferably houses the required mechanical and electrical feed-through for unit 500 which are standard components of wafer chuck assemblies.

FIG. 5B is a perspective view of the wafer chuck 560 and electromagnetic field generator top plate of FIG. 5A with open frame apparatus 510 exposed for clarity. Wafer chuck 560 is shown supported by wafer seat 565 and shaft 555 passing through opening 545 in base plate 535. Base plate 535 may have the configuration of open frame 210 (FIG. 2), 320 (FIG. 3) or 410 (FIG. 4). As an example, the base plate configuration 410 (FIG. 4) is illustrated, though electrical winding pairs 440 and 445 (FIG. 4) are omitted from the illustration. Wafer seat 565 may include heating and/or cooling elements for maintaining temperature control of the wafer 530.

In FIG. 5A, the portions of the electromagnetic field generator/wafer chuck unit 500 which are not responsible for generating a magnetic field are preferably constructed of non-magnetic materials. The structures immediately surrounding the wafer, for example within 3 or 4 inches of the wafer, including wafer chuck 560, clips 520, wafer seat (565 in FIG. 5B), shaft (555 in FIG. 5B), cover plate 540, and open frame apparatus 510 are preferably constructed from non-magnetic stainless steel alloys 321, 316 or 310, aluminum, or copper. The remaining structures of wafer chuck 560 may also be constructed from these non-magnetic materials 321, 316 or 310, or may be constructed from stainless steel alloy 304. Stainless steel alloy 304 becomes magnetized over time when exposed to high magnetic fields and so should not be used in close proximity to the wafer 530.

The examples provided have used a two-magnetic-element design, with each magnet element having a different number of turns "n" of magnetic wire, and each energized by a separate power supply to provide the optimum current "I" through the element. In this and other embodiments where the magnetic flux is proportional to the current, it is assumed that the soft magnetic core is not magnetically saturated at the maximum current, otherwise it is not possible to vary the magnetic flux with a proportional variation in the current.

In another of the preferred embodiments, a single power supply is used to energize each magnetic element. The magnetic flux from any magnetic element is directly proportional to either "n" or "I" and thus the magnetic flux at any point from magnetic element #1 is proportional to n1 and I1 and from magnetic element #2 is proportional to n2 and I2. Thus with any combination of n1, n2, I1 and I2, the number of turns in an element can be adjusted from n1 to n1' so that the magnetic element will produce the same magnetic flux when energized with current I2 as it did with n1 and current I1. In this manner, the same power supply can be used for both magnetic elements.

The required number of new turns can be calculated as:

$$n1'=n1*I1/I2$$

In an example of this embodiment, where I1 is 6 amps, n1 is 185 turns, I2 is 8 amps and n2 is 288 turns, to achieve the same result using the same power supply (I1=I2=8 amps), the number of turns (n1) is changed to 6/8*n1 or about 139 turns.

It should be noted that while the example has used just two magnetic element, the technique applies equally to multiple magnetic elements.

Figure 12:
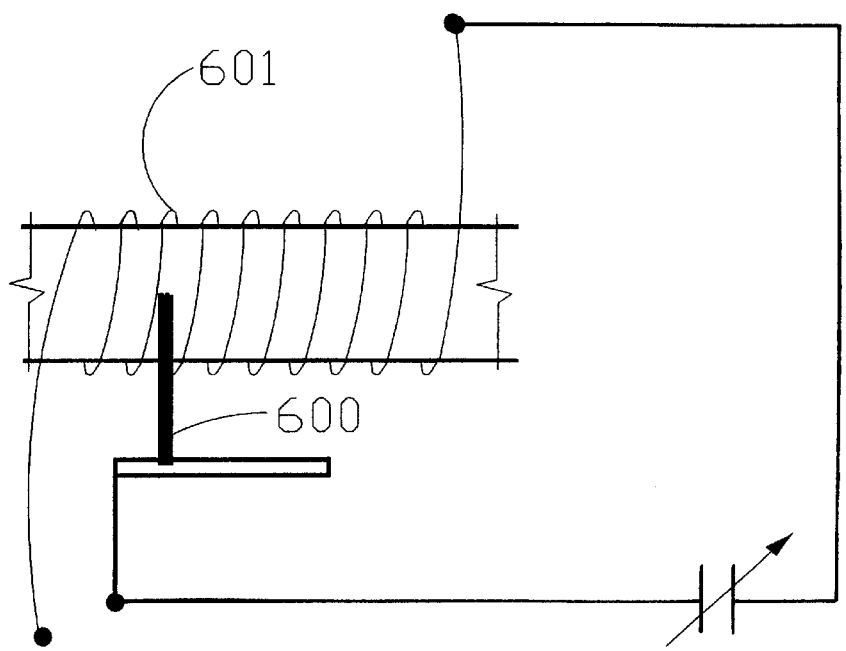
FIG. 12 illustrates a sliding contact to change the effective number of turns in a coil.

Referring to FIG. 12, a simple method to adjust the effective number of turns on a coil is illustrated. A sliding contact 600 makes adjustable contact along the coil 601 to change the effective number of turns. Using a similar method to that illustrated in FIG. 12, the effective number of turns on any coil illustrated in FIGS. 1, 2, 3, 4, 5A, 5B, 11A or 11B may be adjusted. In this manner, the effective number of turns is widely variable and therefor readily supports use of a single power supply to provide variable magnetic flux.

Method of Operation

According to one aspect of the present invention, the electromagnetic field generator is operated in a cyclic or pulsed manner during deposition; the field applied to the electromagnetic field generator is cycled on and off in a periodic pattern. Several embodiments of cycling methods of the invention are illustrated in FIGS. 6 through 9. These different methods are applicable to generation of a single magnetic field in one direction, or they may be used to generate magnetic fields in different directions by controlling the phase between the two energizing currents.

Figure 9:
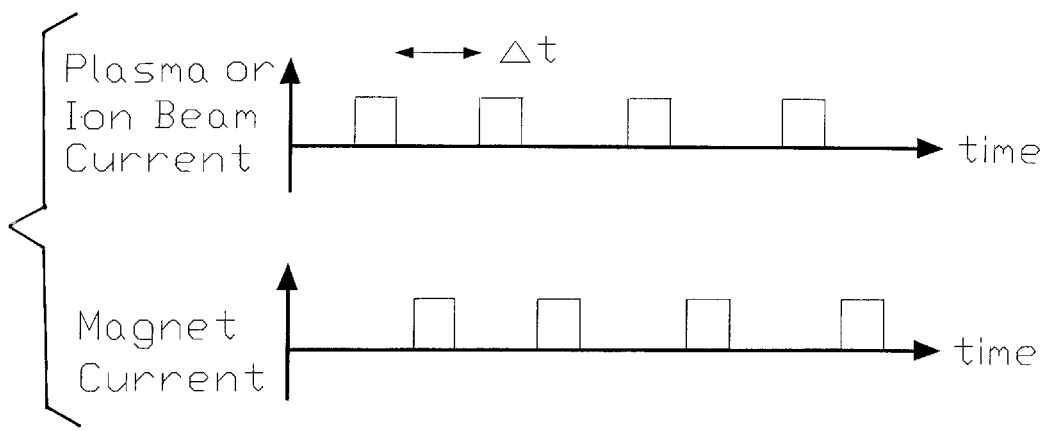
FIG. 9 is a plot of electromagnetic field generator current vs. time using positive (+) pulsed direct current operation with a phase difference between the electromagnetic field generator and the ion beam currents.

FIG. 6A shows the field generator current as alternating current (AC); in FIG. 6B, the electromagnetic field generator current is positive and negative (+/−) pulsed direct current (DC). FIG. 6C shows the alternating electromagnetic field generator current of FIG. 6A with an exponentially decaying amplitude for demagnetization procedures. FIG. 7A shows half-wave rectified alternating current; FIG. 7B shows positive (+) pulsed direct current. FIG. 7C shows a positive direct current bias; a negative direct current bias could alternatively be used. FIG. 8A shows alternating current operation with a positive direct current bias; FIG. 8B shows pulsed direct current operation with a positive direct current bias. FIG. 9 shows positive (+) pulsed direct current operation with a phase difference between the electromagnetic field generator and the ion beam currents.

The alternating current of FIG. 6A and the positive and negative (+/−) pulsed direct current of FIG. 6B provide a net zero average field effect on the ion beam, and are most advantageously utilized with soft adjacent layer (SAL) films, such as NiFe-based films, for example NiFeCr, NiFeRh, NiFeTa, or amorphous Co-based alloy materials. FIG. 6C shows alternating current with an exponentially decaying amplitude which may advantageously be used with or without substrates to demagnetize susceptible parts in the fixture weldment magnetized by previous operation of the magnetic fixture.

The half-wave rectified alternating current of FIG. 7A and positive (+) pulsed direct current of FIG. 7B provide field-free deposition during a portion of the total process time, which reduces the total applied-field effect and allows surfaces which may have become charged to neutralize. This technique is particularly applicable to unidirectional antiferromagnetic materials, for example the antiferromagnetic films such as NiO, FeMn or NiCoO used in MR heads or also PtMn, PtPdMn, IrMn, and PtIrMn. Note that while the cycling methods of FIGS. 6A and 6B provide uniaxial magnetic film deposition (one axis but both "up" and "down" orientations), the cycling methods of FIGS. 7A and 7B provide unidirectional magnetic film deposition (one orientation only), as does the direct current bias of FIG. 7C.

For some materials, application of a directional field (DC bias) during the entire deposition process may be required. The alternating current operation with a positive direct current bias of FIG. 8A and pulsed direct current operation with a positive direct current bias of FIG. 8B maintain some level of orienting field during the entire deposition process. By adding alternating current or pulsed components, the required direct current bias can be minimized, thus minimizing any distortion of the plasma or ion beam. The current embodiments of FIGS. 8A and 8B are therefore compatible with the widest range of different types of magnetic films.

FIG. 9 shows positive (+) pulsed direct current operation with a phase difference between the electromagnetic field generator and the ion beam or plasma source currents. According to an aspect of the present invention, the ion source and electromagnetic fields can be cycled and the phase difference between the two cycles can be adjusted to a specific value. When the ion beam or plasma source is on, the magnetic target material is sputtered; when the ion beam or plasma source is off, no sputtering will occur. By adjusting the relative phase of the two cycles, the portion of the deposition time during which the magnetic field is applied can be controlled.

For example, in order to minimize the magnetic field effect on the ion beam or plasma source, a ninety degree phase difference can be used, as shown in FIG. 9. In this case, there is no applied magnetic field during the sputtering, so the ion beam is unaffected by the magnetic field. Preferably, to ensure proper film orientation, the frequency range of operation is limited such that the frequency is at least high enough so that the delay time from peak to peak field condition is no more than the time required to deposit one or two monolayers of magnetic film but low enough to prevent eddy current heating of the magnetic structure. These requirements lead to a desired frequency less than about 10 Hz but greater than 1/t, where t is deposition time in seconds. This range of frequencies, (between 1/(deposition time in seconds) Hz and 10 Hz) applies to any of the variable current techniques illustrated in FIGS. 6A through 9.

Figure 10A:
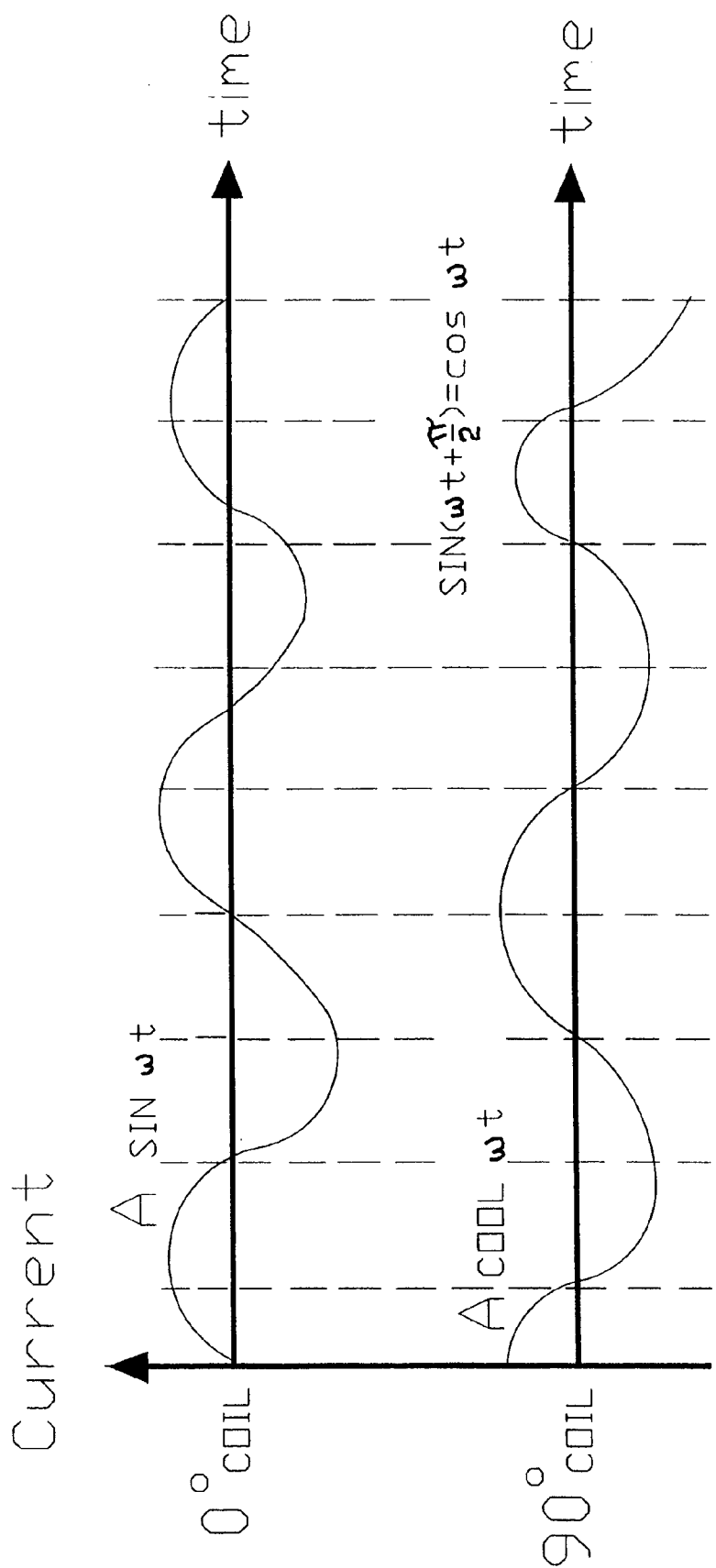
FIG. 10A illustrates the phase relationship of the current in two orthogonal coil, producing a continuously changing orientation of the magnetic field.
Figure 10B:
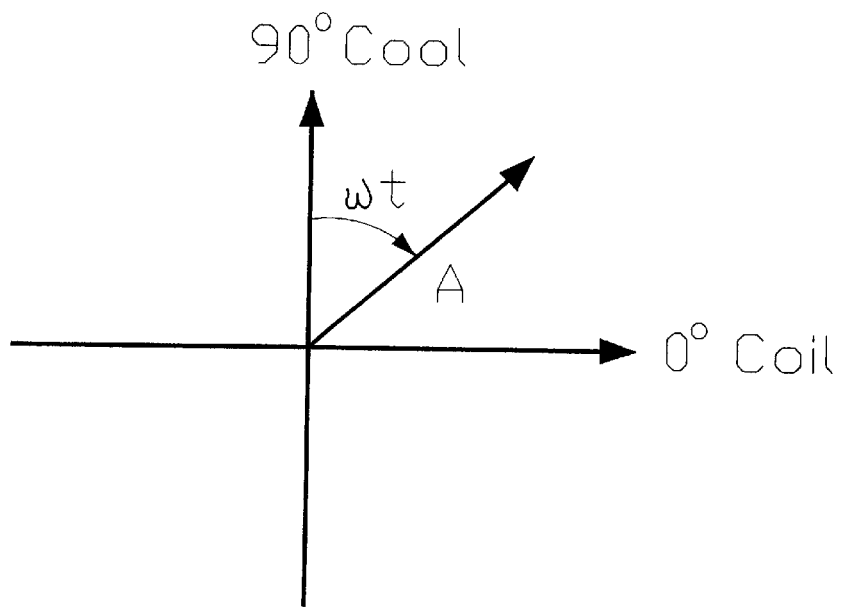
FIG. 10B illustrates the field orientation, as related to FIG. 10A.

FIG. 10A illustrates a phase relationship for the current in two orthogonal coils, such as 120 and 130 in FIG. 1, that will produce a continuously rotating field orientation on the substrate. When the sinusoidal current of the 0 coil in FIG. 10A is applied to coil 120, and the sinusoidal current of the 90 coil in FIG. 10A is applied to coil 130, the resulting magnetic field will rotate over time, as illustrated in FIG. 10B. One effect of this continuously rotating magnetic field orientation is that the applied film is demagnetized.

As illustrated in FIG. 10A, the current in the 0 coil is described by the formula A*sin (omega*t) and the current in the 90 coil is described by the formula A*cos (omega*t). A is a current amplitude, omega is angular velocity and t is time. The combination of these two sinusoidal orthogonal magnetic fields produces a magnetic field that rotates with angular velocity omega. This rotational velocity is depicted in FIG. 10B.

Although different embodiments of the present invention have been described in detail herein with reference to the accompanying drawings, it is to be understood that the invention is not limited to these precise embodiments. It is further understood that the figures provide illustrative examples and do not describe or illustrate the only embodiments contemplated in the invention. Various changes and further modifications may be effected therein by one skilled in the art without departing from the scope or spirit of the invention as defined in the appended claims.

We claim:

1. A device comprising:

first and a second open-frame electromagnetic assembly;

a first pair of spaced apart coils wound around the first assembly and configured to generate a first magnetic field in a first direction when energized by current;

a second pair of spaced apart coils wound around the first assembly and configured to generate a second magnetic field in a second direction when energized by current; and a plurality of field-shaping pole pieces above corners of the first and second open-frame electromagnetic assemblies.

2. A device for controlling deposition of a magnetic material from a target onto a substrate, the device comprising:

a substantially flat open-frame electromagnetic assembly defining a central opening;

a first pair of spaced apart electromagnetic members, the first pair being wound around the open-frame and configured for generating a first magnetic field in a first direction when energized by electric current;

a second pair of spaced apart electromagnetic members, the second pair being wound around the open-frame and configured for generating a second magnetic field in a second direction when energized by electric current;

a variable current source connected to the first and the second pairs, the variable current source being selected from the group consisting of: half-wave rectified alternating current, alternating current with direct current bias, and direct current; and a controller for controlling current supplied to the first pair independently of the second pair and to provide a selectably oriented magnetic field pattern from the first and second magnetic fields.

3. The device of claim 2, wherein the variable current is half-wave rectified alternating current.

4. The device of claim 2, wherein the variable current is alternating current with direct current bias.

5. The device of claim 2, wherein the variable current is direct current.

6. The device of claim 2, wherein the variable current is pulsed direct current.

7. The device of claim 2, wherein the variable current operates at frequencies less than about 10 Hz.

8. The device of claim 2, wherein the variable current is positive and negative pulsed direct current.

9. The device of claim 2, wherein the variable current is positive pulsed direct current.

10. The device of claim 2, wherein the variable current is pulsed direct current with direct current bias.

11. The device of claim 2 for use with an ion beam generator for generating intermittently an ion beam current on the substrate or the target, wherein the controller is configured to pulse the variable current source in a predetermined phase relationship with the ion beam current.

12. The device of claim 11, wherein both the first and second magnetic fields are about ninety degrees out of phase with the ion beam current.

13. The device of claim 11, wherein the first and second magnetic fields are pulsed at a frequency less than about 10 Hz.

14. The device of claim 2, wherein the first and second magnetic fields are substantially orthogonal and the variable current further comprises:
 a first variable current in the first pair of spaced apart electromagnetic members; and
 a second variable current in the second pair of spaced apart electromagnetic members.

15. The device of claim 14, wherein the first variable current is sinusoidal and described by A*sin(omega*t) and the second variable current is sinusoidal and described by A*cos(omega*t), where A is current magnitude, omega is radial velocity and t is time, the combination of the first and second variable currents producing a rotating magnetic field with radial velocity omega.

16. The device of claim 2, wherein the amplitude and direction of the magnetic field pattern are substantially uniform in a region near the central opening.

17. The device of claim 2, wherein the open-frame electromagnetic assembly is substantially rectangular with truncated corners.

18. The device of claim 19, wherein the open-frame electromagnetic assemblies are substantially rectangular with truncated corners.

19. A device for controlling deposition of a magnetic material on a substrate comprising:
 two substantially flat open-frame electromagnetic assemblies defining a central opening and spaced from each other;
 a first pair of spaced apart electromagnetic members wound around the frame electromagnetic assemblies and the first pair being adapted to generate a first magnetic field in a first direction;
 a second pair of spaced apart electromagnetic members wound around the frame electromagnetic assemblies and the second pair being adapted to generate a second magnetic field in a second direction; and
 a controller for controlling current supplied to the first pair independently of the second pair and to provide a selectably oriented magnetic field pattern from the first and second magnetic fields.

20. The device of claim 19, wherein the first pair and second pair of electromagnetic members are two pairs each of orthogonal coils, and wherein each of the two open-frame electromagnetic assemblies are individually wrapped with the two pairs each of orthogonal electrical coils.

21. The device of claim 19, wherein the amplitude and direction of the magnetic field pattern are substantially uniform in a region near the central opening.

22. The new device of claim 19 wherein a central opening of a first one of the open-frame electromagnetic assemblies is smaller than a central opening of a second one of the open-frame electromagnetic assemblies.

23. The device of claim 19, further comprising at least one current source connected to the first and second pair of electromagnetic members, the current source being selected from the group consisting of: alternating current, half-wave rectified alternating current, alternating current with direct current bias, direct current, pulsed direct current, positive and negative pulsed direct current, positive pulsed direct current, and pulsed direct current with direct current bias.

24. The device of claim 23, wherein the at least one current source comprises a first current source connected to the first pair of electromagnetic members and a second current source connected to the second pair of electromagnetic members, and wherein the first and second current sources are independently controlled.

25. The device of claim 24, wherein the first current is sinusoidal and described by A*sin(omega*t) and the second current is sinusoidal and described by A*cos(omega*t), where A is current magnitude, omega is radial velocity and t is time, the combination of the first and second currents producing a rotating magnetic field with radial velocity omega.

26. The device of claim 23 for use with an ion beam generator adapted to generate intermittently an ion beam current on the substrate or the target, wherein the controller is configured to pulse the variable current source in a predetermined phase relationship with the ion beam current.

27. The device of claim 26, wherein both first and second magnetic fields are about ninety degrees out of phase with the ion beam current.

28. The device of claim 26, wherein the first and second magnetic fields are pulsed at a frequency less than about 10 Hz.

* * * * *

UNITED STATES PATENT AND TRADEMARK OFFICE
CERTIFICATE OF CORRECTION

PATENT NO. : 6,545,580 B2
DATED : April 8, 2003
INVENTOR(S) : Hari S. Hedge et al.

It is certified that error appears in the above-identified patent and that said Letters Patent is hereby corrected as shown below:

<u>Column 8,</u>
Line 27, the word -- a -- should be inserted before "first".

Signed and Sealed this

Thirteenth Day of May, 2003

JAMES E. ROGAN
*Director of the United States Patent and Trademark Office*